(12) United States Patent
Woo et al.

(10) Patent No.: US 11,304,300 B2
(45) Date of Patent: Apr. 12, 2022

(54) FOLDABLE ELECTRONIC DEVICE INCLUDING FLEXIBLE PRINTED CIRCUIT BOARD

(71) Applicant: Samsung Electronics Co., Ltd., Gyeonggi-do (KR)

(72) Inventors: Jeong Woo, Gyeonggi-do (KR); Jungchul An, Gyeonggi-do (KR); Seungki Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 218 days.

(21) Appl. No.: 16/789,666

(22) Filed: Feb. 13, 2020

(65) Prior Publication Data

US 2020/0267839 A1 Aug. 20, 2020

(30) Foreign Application Priority Data

Feb. 19, 2019 (KR) .................. 10-2019-0019515

(51) Int. Cl.
*H05K 7/00* (2006.01)
*H05K 1/14* (2006.01)
(Continued)

(52) U.S. Cl.
CPC .......... *H05K 1/147* (2013.01); *H01R 12/777* (2013.01); *H01R 12/79* (2013.01); *H05K 1/0281* (2013.01); *H05K 1/118* (2013.01); *H05K 5/0017* (2013.01); *H05K 5/0086* (2013.01); *H05K 5/0226* (2013.01); *H05K 2201/10037* (2013.01); *H05K 2201/10128* (2013.01)

(58) Field of Classification Search
CPC ...... H05K 1/147; H05K 1/0281; H05K 1/118; H05K 5/0017; H05K 5/0086; H01R 12/777; H01R 12/79
USPC ........................................................ 361/749
See application file for complete search history.

(56) References Cited

U.S. PATENT DOCUMENTS

2012/0268905 A1 10/2012 Watase
2013/0082955 A1 4/2013 Becze et al.
(Continued)

FOREIGN PATENT DOCUMENTS

CN 206400960 U 8/2017
CN 107564413 A 1/2018
(Continued)

OTHER PUBLICATIONS

International Search Report dated May 22, 2020.
European Search Report dated Jan. 7, 2022.

*Primary Examiner* — Andargie M Aychillhum
(74) *Attorney, Agent, or Firm* — Cha & Reiter, LLC.

(57) ABSTRACT

According to an embodiment, it is possible to provide an electronic device including: a housing; a first printed circuit board disposed in the housing; a second printed circuit board disposed in the housing and spaced apart from the first printed circuit board; a first flexible printed circuit board electrically connecting the first printed circuit board and the second printed circuit board; and a second flexible printed circuit board electrically connecting the first printed circuit board and the second printed circuit board, in which the second flexible printed circuit board may be longer than the first flexible printed circuit board. Other embodiments are also disclosed.

18 Claims, 13 Drawing Sheets

(51) Int. Cl.
*H01R 12/79* (2011.01)
*H01R 12/77* (2011.01)
*H05K 5/02* (2006.01)
*H05K 5/00* (2006.01)
*H05K 1/11* (2006.01)
*H05K 1/02* (2006.01)

(56) References Cited

U.S. PATENT DOCUMENTS

| | | |
|---|---|---|
| 2014/0049895 A1* | 2/2014 | Lee .................. G06F 1/1683 |
| | | 361/679.28 |
| 2014/0073270 A1 | 3/2014 | Chou et al. |
| 2016/0085265 A1 | 3/2016 | Park et al. |
| 2016/0147263 A1 | 5/2016 | Choi et al. |
| 2018/0073236 A1 | 3/2018 | Hayashi et al. |
| 2018/0076236 A1 | 3/2018 | Kwon et al. |
| 2018/0077810 A1* | 3/2018 | Moon .................. G06F 1/1681 |
| 2018/0324964 A1 | 11/2018 | Yoo et al. |

FOREIGN PATENT DOCUMENTS

| | | |
|---|---|---|
| EP | 2975489 A1 | 1/2016 |
| EP | 3388977 A1 | 10/2018 |
| KR | 10-2010-0115641 A | 10/2010 |
| KR | 10-2018-0099528 A | 9/2018 |
| KR | 10-2018-0108554 A | 10/2018 |

\* cited by examiner

FIG.12

FOLDABLE ELECTRONIC DEVICE INCLUDING FLEXIBLE PRINTED CIRCUIT BOARD

CROSS-REFERENCE TO RELATED APPLICATION(S)

This application is based on and claims priority under 35 U.S.C. 119 to Korean Patent Application No. 10-2019-0019515, filed on Feb. 19, 2019, in the Korean Intellectual Property Office, the disclosure of which is herein incorporated by reference in its entirety.

TECHNICAL FIELD

One or more embodiments disclosed herein generally relate to a foldable electronic device including a flexible printed circuit board.

BACKGROUND

The electronic device related to the instant application may be a device that performs specific functions in accordance with programs installed therein, such as home appliances, electronic notepads, mobile multimedia players, mobile communication terminals, tablet PCs, video/sound devices, desktop/laptop computers, automobile navigation systems, etc. For example, these electronic devices can output information stored therein as sound or images. As development of these electronic devices have advanced and high-speed and large-capacity wireless communication networks have been popularized recently, an increasing number of functions can be integrated in a single electronic device such as a mobile communication terminal. These functions may include communication, entertainment such as gaming, multimedia such as playback of music/video, communication and security for mobile banking, calendar, electronic wallet, etc. These electronic devices are also increasingly miniaturized so that users can conveniently carry them.

As the above functions of the electronic devices have increased, users can not only make voice calls or write short text messages, but also use multimedia services of the electronic devices. In order to provide users with convenience when using the multimedia services, the electronic devices are being equipped with wider display panels. Further, recently, foldable electronic devices equipped with flexible display devices are being implemented.

SUMMARY

A foldable electronic device according to an embodiment includes one display panel and may include two housings surrounding the display panel with the folding region of the display panel therebetween. The electronic device may include various electronic devices for performing various functions and operations such as communication, entertainment, multimedia, and security. These electronic parts may be separately disposed in the two housings subject to various design considerations, such as spatial mounting within the electronic devices.

The electronic parts are mounted on a PCB (Printed Circuit Board) included in the housing and may be electrically connected to one another through at least one FPCB (Flexible Printed Circuit Board). For example, the FPCB may be a C2C (connector to connector) FPCB connecting connectors respectively formed on two different substrates to each other.

Various signal lines may be disposed on the FPCB, such as signal lines for implementing various functions including high-quality displaying, operating a high-performance camera and/or stereo speakers, or power supply. According to a certain embodiment, when the FPCB is connected to two substrates disposed in different housings, some signal lines disposed on the FPCB that are sensitive to impedance may be subject to a greater possibility of signal loss.

A foldable electronic device according to an embodiment may include: a hinge structure having a folding axis and a foldable housing which includes a folding section where the electronic device is folded about the folding axis, a first housing structure, and a second housing structure. The first housing structure may be connected to the hinge structure, and may include a first surface facing a first direction, a second surface facing a second direction opposite to the first direction, and a first printed circuit board having a first plurality of electronic components mounted thereon. The second housing structure may be connected to the hinge structure, and may include a third surface facing a third direction, a fourth surface facing a fourth direction opposite to the third direction, and a second printed circuit board having a second plurality of electronic components mounted thereon. The second housing structure may be configured to be foldable on the first housing structure around the hinge structure. The first surface may face the third surface when the electronic device is folded and the third direction may coincide with the first direction when the electronic device is unfolded. The device may further include a flexible display disposed in the foldable housing and extending from the first surface of the first housing structure to the third surface of the second housing structure, a first flexible printed circuit board configured to cross at least a portion of the hinge structure and configured to electrically connect the first printed circuit board and the second printed circuit board through first connection terminals at both ends thereof, and a second flexible printed circuit board configured to cross at least a portion of the hinge structure and configured to electrically connect the first printed circuit board and the second printed circuit board through second connection terminals at both ends thereof. The first signal lines having a first signal characteristic may be disposed on the first flexible printed circuit board and second signal lines having a second signal characteristic may be disposed on the second flexible printed circuit board.

An electronic device according to an embodiment may include: a housing: a first printed circuit board disposed in the housing; a second printed circuit board disposed in the housing and spaced apart from the first printed circuit board; a first flexible printed circuit board electrically connecting the first printed circuit board and the second printed circuit board; and a second flexible printed circuit board electrically connecting the first printed circuit board and the second printed circuit board, in which the second flexible printed circuit board may be longer than the first flexible printed circuit board.

BRIEF DESCRIPTION OF THE DRAWINGS

The above and other aspects, features, and advantages of the disclosure will be more apparent from the following detailed description taken in conjunction with the accompanying drawings, in which:

FIG. 12 is schematic diagrams showing circuits disposed on each layer when the second flexible printed circuit board according to an embodiment includes a plurality of layers;

DETAILED DESCRIPTION

According to certain embodiments, it is possible to provide a foldable electronic device that includes at least two flexible printed circuit boards connecting two substrates respectively included in two different housings, and includes a plurality of signal lines separately disposed on the at least two flexible printed circuit boards for improved signal characteristics.

According to certain embodiments, since a plurality of signal lines are separately disposed on at least the two flexible printed circuit boards for improved signal characteristics, it is possible to implement a design that minimizes impedance influence.

The placement of the plurality of signal lines is done in consideration of the various characteristics (e.g., sensitivity) of the signal lines. Thus it is possible to prevent deterioration of the performance of the electronic device.

According to an embodiment, since there is provided a wiring method that gives approximately the same lengths to different signal lines formed on a layer, it is possible to prevent timing skew or delay and there is no need for an additional wiring to reduce timing skew or delay when designing the signal lines.

Figure 1:
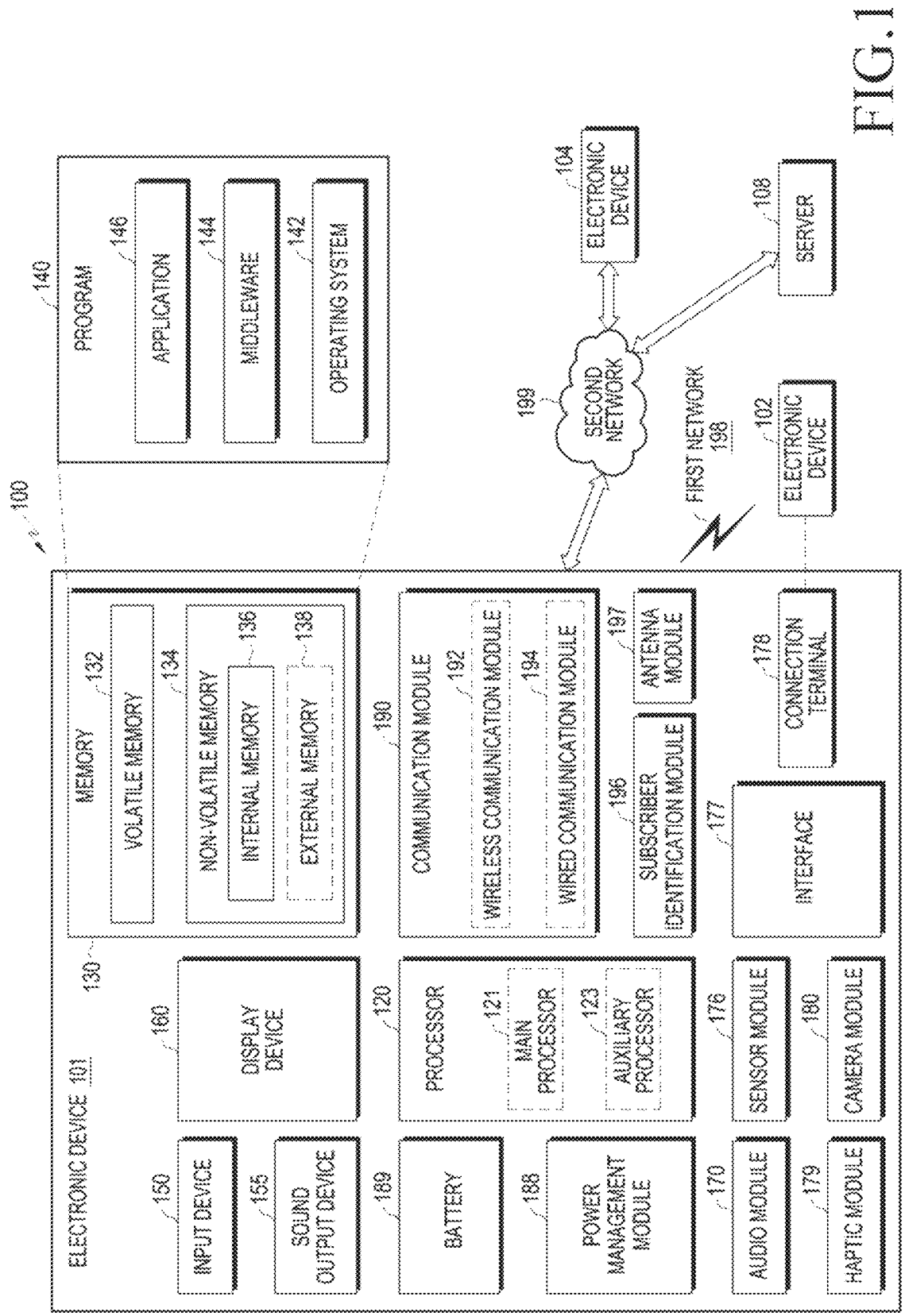
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing recordings, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
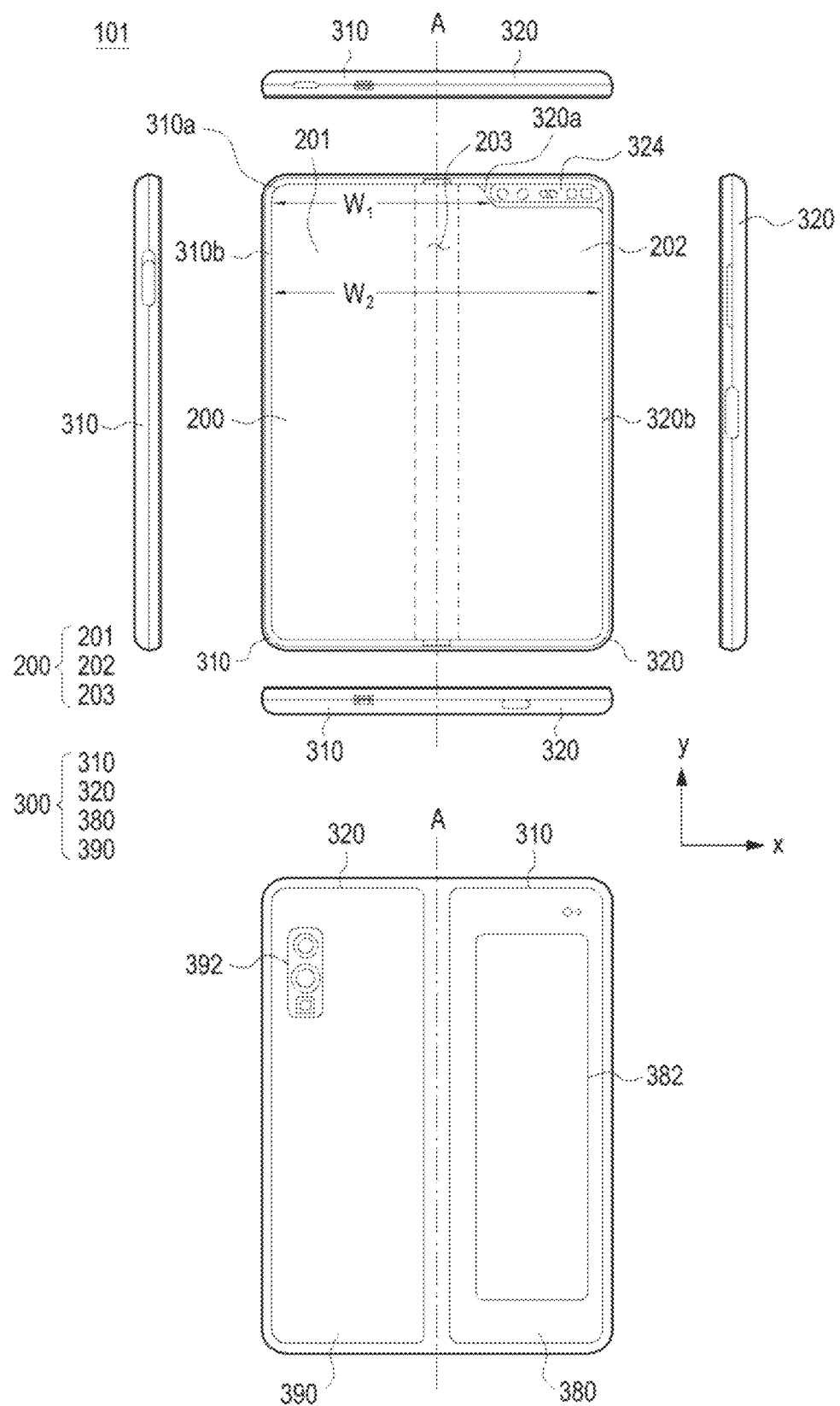
FIG. 2 is plan views illustrating an electronic device in an unfolded state according to an embodiment.
Figure 3:
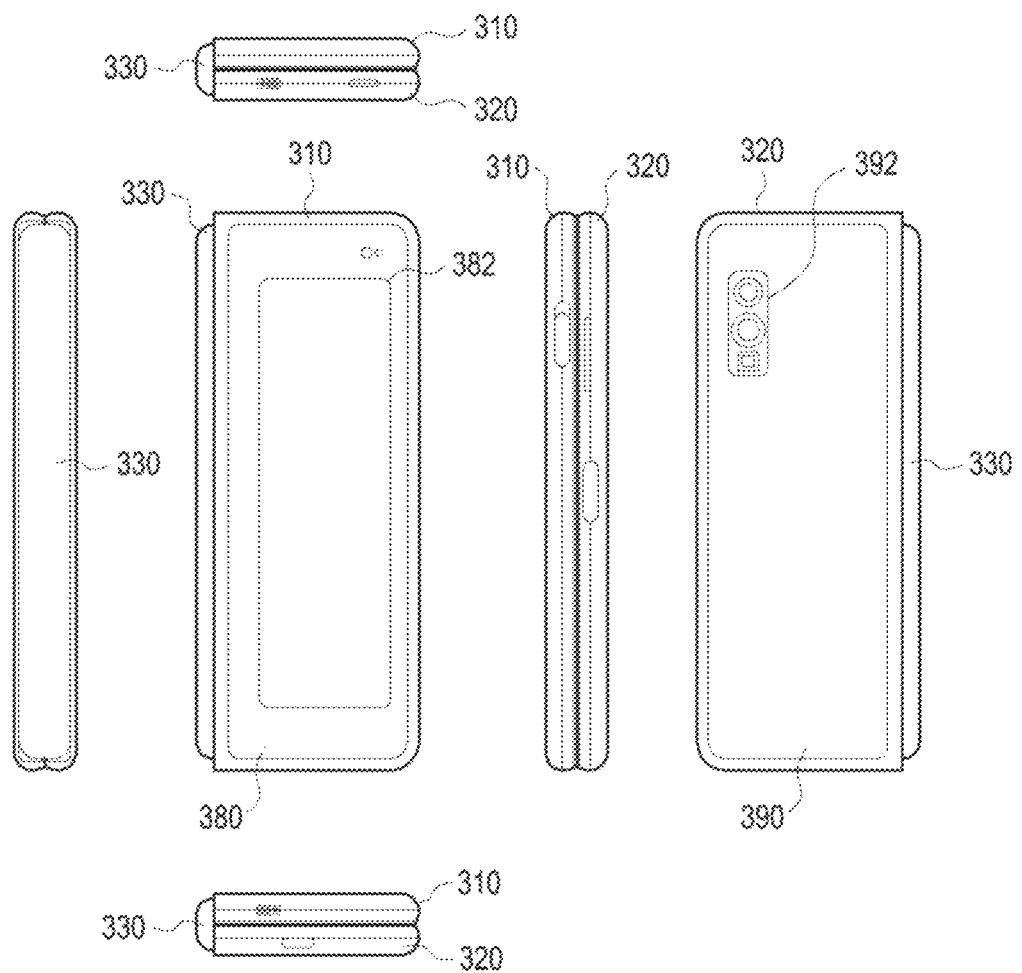
FIG. 3 is plan views illustrating an electronic device in a folded state according to an embodiment.

FIG. 2 is plan views illustrating an electronic device in an unfolded state according to an embodiment. FIG. 3 is plan views illustrating an electronic device in a folded state according to an embodiment.

Referring to FIGS. 2 and 3, in an embodiment, an electronic device 101 may include: a foldable housing 300; a hinge cover (e.g., a hinge cover 330 in FIG. 3) covering a foldable portion of the foldable housing 300; and a flexible or foldable display 200 (or "display 200" for short) (e.g., the display device 160 in FIG. 1) disposed in a space defined by the foldable housing 300. According to an embodiment, the surface in which the display 200 is disposed may be referred to as the front surface of the electronic device 101. The opposite surface of the front surface may be referred to as the rear surface of the electronic device 101. The surface surrounding the space between the front surface and the rear surface may be referred to as the side of the electronic device 101.

Figure 4:
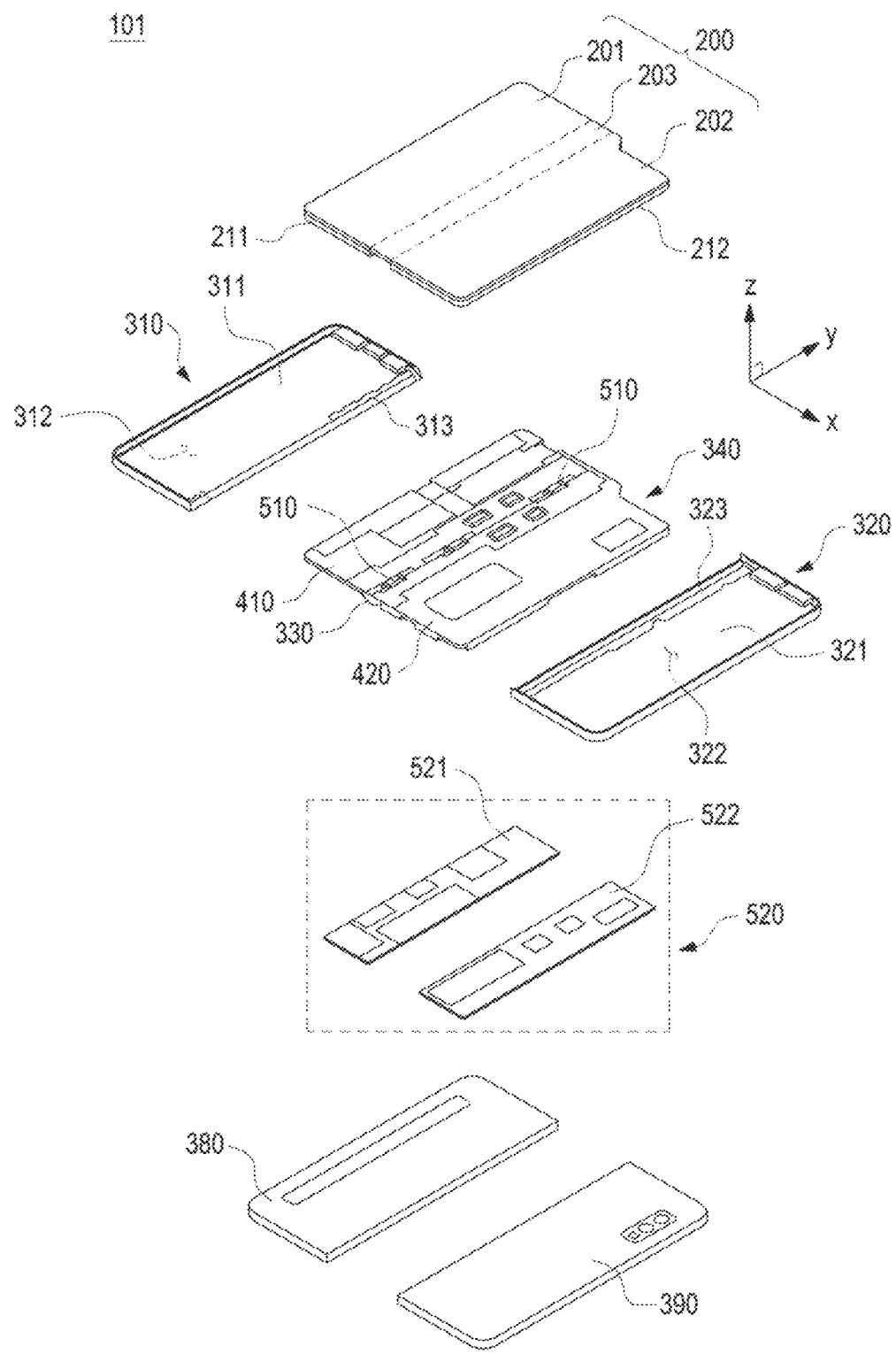
FIG. 4 is an exploded perspective view of the electronic device according to an embodiment.

According to an embodiment, the foldable housing 300 may include a first housing structure 310, a second housing structure 320 having a sensor section 324, a first rear cover 380, a second rear cover 390, and a hinge structure (a hinge structure 510 in FIG. 4). The foldable housing 300 of the electronic device 101 is not limited to the type and combination shown in FIGS. 2 and 3, and may be implemented using other shapes or components. For example, in another embodiment, the first housing structure 310 and the first rear cover 380 may be integrally formed, and the second housing structure 320 and the second rear cover 390 may be integrally formed.

According to an embodiment, the first housing structure 310 is connected to a hinge structure (e.g., the hinge structure 550 in FIG. 4) and may have a first surface facing a first direction and a second surface facing a second direction opposite to the first direction. The second housing structure 320 is connected to the hinge structure 510, has a third surface facing a third direction and a fourth surface facing a fourth direction opposite to the third direction, and can rotate about the hinge structure 510 (or, a hinge shaft) with respect to the first housing structure 310. Accordingly, the electronic device 101 can be folded or unfolded. In the electronic device 101, the first surface may face the third surface while folded, and the third direction may be the same as the first direction while unfolded.

According to an embodiment, the first housing structure 310 and the second housing structure 320 are disposed at both sides with a folding axis (axis A) therebetween, and the entire shape is symmetric with respect to the folding axis A. As described below, the first housing structure 310 and the second housing structure 320 may be changed in angle or distance therebetween in accordance with whether the electronic device 101 is unfolded or folded or in an intermediate partially unfolding. According to an embodiment, the second housing structure 320, unlike the first housing structure 310, additionally has a sensor section 324 in which various sensors are disposed, but they may be symmetrical in other areas.

According to an embodiment, as shown in FIG. 2, the first housing structure 310 and the second housing structure 320 may form a recess together for accommodating the display 200. According to an embodiment, the recess may have two or more different widths in a direction perpendicular to the folding axis A due to the sensor section 324.

According to an embodiment, the recess may have a first width w1 between a first portion 310a that is parallel with the folding axis A in the first housing structure 310 and a first portion 320a formed at the edge of the sensor section of the second housing structure 320. The recess may have a second width w2 defined by a second area 310b of the first housing structure 310 and a second portion 320b that is not the sensor section 324 and is parallel with the folding axis A in the second housing structure 320. In this case, the second width w2 may be larger than the first width w1. Thus, the first portion 310a of the first housing structure 310 and the first portion 320a of the second housing structure 320, which are asymmetric to each other, may define the first width w1 of the recess, and the second portion 310b of the first housing structure 310 and the second portion 320b of the second housing structure 320, which are symmetric to each other, may define the second width w2 of the recess. According to an embodiment, the first portion 320a and the second portion 320b of the second housing structure 320 may have different distances from the folding axis A. The widths of the recess are not limited to the example shown in the figures. In another embodiment, the recess may have a plurality of widths due to the shape of the sensor section 324 or the asymmetric shapes of the first housing 310 and the second housing 320.

According to an embodiment, at least a portion of the first housing structure 310 and the second housing structure 320 may be made of a metallic material or a nonmetallic material that has rigidity of a selected intensity to support the display 200. At least a portion made of the metallic material can provide a ground plane of the electronic device 101 and may be electrically connected with a ground line formed on a printed circuit board (e.g., a printed circuit board 520 shown in FIG. 4).

According to an embodiment, the sensor section 324 may be defined to have a predetermined area adjacent to a corner of the second housing structure 320. However, the disposition, shape, and size of the sensor section 324 are not limited to the example shown in the figures. For example, in another embodiment, the sensor section 324 may be provided at another corner of the second housing structure 320 or in a predetermined area between an upper corner and a lower corner. In an embodiment, components for performing various functions of the electronic device 101 may be exposed on the front surface of the electronic device through the sensor section 324 or one or more openings provided in the sensor section 324. In various embodiments, the components may include various kinds of sensors, such as a front camera, a receiver, a proximity sensor, etc.

According to an embodiment, the first rear cover 380 is disposed at one side from the folding axis on the rear surface of the electronic device 101 and, for example, may have a substantially rectangular shape, and whose periphery may be surrounded by the first housing structure 310. Similarly, the second rear cover 390 is disposed at the other side from the folding axis on the rear surface of the electronic device 101 and the periphery thereof may be surrounded by the second housing structure 320.

According to an embodiment, the first rear cover 380 and the second rear cover 390 may be substantially symmetrical to each other with respect to the folding axis (axis A) therebetween. However, the first rear cover 380 and the second rear cover 390 are not necessarily symmetrical, and in another embodiment, the electronic device 101 may include a first rear cover 380 and a second rear cover 390 that have asymmetric shapes. In another embodiment, first rear cover 380 may be formed integrally with the first housing structure 310, and the second rear cover 390 may be may be formed integrally with the second housing structure 320.

According to an embodiment, the first rear cover 380, the second rear cover 390, the first housing structure 310, and the second housing structure 320 may define a space in which various components (e.g., a printed circuit board or a battery) of the electronic device 101 can be disposed. According to an embodiment, one or more components may be disposed or visually exposed on the rear surface of the electronic device 101. For example, at least a portion of a sub-display may be visually exposed through the first rear surface section 382 of the first rear cover 380. In another embodiment, one or more components or sensors may be visually exposed through a second rear surface section 392 of the second rear cover 390. In one embodiment, the sensors may include a proximity sensor and/or a rear camera.

According to an embodiment, the front camera exposed on the front surface of the electronic device 101 through one or more openings in the sensor section 324 or the rear camera exposed through the second rear surface section 392 of the second rear cover 390 may include one or a plurality of lenses, an image sensor, and/or an image signal processor. A flash, for example, may include a light emitting diode or a xenon lamp. In an embodiment, two or more lenses, including an infrared camera, a wide-angle lens, and a telephoto lens, and image sensors may be disposed on one surface of the electronic device 101.

Referring to FIG. 3, the hinge cover 330 is disposed between the first housing structure 310 and the second housing structure 320 and may be configured to cover internal components (e.g., a hinge structure 510 in FIG. 4). According to an embodiment, the hinge cover 330 may be covered by a portion of the first housing structure 310 and the second housing structure 320 or may be exposed to the outside, depending whether the electronic device 101 is folded, unfolded, or partially unfolded.

According to an embodiment, as shown in FIG. 2, when the electronic device 101 is unfolded, the hinge cover 330 can be covered by the first housing structure 310 and the second housing structure 320. As another example, as shown in FIG. 3, when the electronic device 101 is fully folded, the hinge cover 330 can be exposed between the first housing structure 310 and the second housing structure 320. As another example, in the intermediate state of partially unfolded in which first housing structure 310 and the second housing structure 320 are folded with a certain angle between 0 and 180 degrees, the hinge cover 330 can be partially exposed between the first housing structure 310 and the second housing structure 320. However, in this case, the exposed area may be smaller than when the device is fully folded. In an embodiment, the hinge cover 330 may have a curved surface.

According to an embodiment, the display 200 may be disposed in a space defined by the foldable housing 300. For example, the display 200 may be seated in the recess formed by the foldable housing 320 and may constitute substantially the entirety of the front surface of the electronic device 101. Accordingly, the front surface of the electronic device 101 may include the display 200, and a partial area of the first housing structure 310 and a partial area of the second housing structure 320 that are adjacent to the display 200. The rear surface of the electronic device 101 may include the first rear cover 380, a partial area of the first housing structure 310 that is adjacent to the first rear cover 380, the second rear cover 390, and a partial area of the second housing structure 320 that is adjacent to the second rear cover 390.

According to an embodiment, the display 200 may mean a display of which at least a partial area can be deformed into a flat surface or a curved surface. According to an embodiment, the display 200 may have a folding section 203, a first section 201 disposed at one side from the folding section 203 (e.g., at the left side of the folding section 203 shown in FIG. 2), and a second section 202 disposed at the other side (e.g., at the right side of the folding section 203 shown in FIG. 2).

However, the divided sections of the display 200 shown in FIG. 2 are examples and the display 200 may be divided into a plurality of sections (e.g., four or more sections), depending on the structure or the function. For example, in the shown embodiment, the folding section 203 is parallel with the y-axis, but in another embodiment, another folding section may be parallel with the x-axis. According to an embodiment, the display 200 may be combined with or disposed adjacent to a touch sensing circuit, a pressure sensor that can measure the intensity (pressure) of a touch, and/or a digitizer that detects a magnetic stylus pen.

According to an embodiment, the first section 201 and the second section 202 may be substantially symmetrical to each other, with the exception that the second section 202, unlike the first section 201, may have a cut notch corresponding to the sensor section 324. In other words, the first section 201 and the second section 202 may have portions that are symmetrical to each other and portions that are asymmetric.

Hereinafter, the operation of the first housing structure 310, the second housing structure 320, and the sections of the display 200 according to whether the electronic device 101 is folded, unfolded, or partially unfolded are described.

According to an embodiment, when the electronic device 101 is unfolded (e.g., FIG. 2), the first housing structure 310 and the second housing structure 320 may be arranged in the same direction to make an angle of 180 degrees. The surface of the first section 201 and the surface of the second section 202 of the display 200 may make 180 degrees and may be arranged to face the same direction (e.g., toward the front surface of the electronic device). The folding section 203 may be coplanar to the first section 201 and the second section 202.

According to an embodiment, when the electronic device 101 is folded (e.g., FIG. 3), the first housing structure 310 and the second housing structure 320 may be arranged to face each other. The surface of the first section 201 and the surface of the second section 202 of the display 200 may face each other while making a small angle (e.g., between 0 to 10 degrees). The folding section 230 may be folded into an at least partially curved surface having a predetermined curvature.

According to an embodiment, when the electronic device 101 is partially unfolded, the first housing structure 310 and the second housing structure 320 may be arranged with a certain angle therebetween. The surface of the first section 201 and the surface of the second section 202 of the display 200 may make an angle that is larger than when folded but smaller than when unfolded. The folding section 203 may be folded into an at least partially curved surface having a second predetermined curvature, where the second curvature may be smaller than that when folded.

FIG. 4 is an exploded perspective view of the electronic device according to an embodiment.

Referring to FIG. 4, in an embodiment, the electronic device 101 may include a foldable housing 300, a display 200, and a substrate assembly 520. The foldable housing may include a first housing structure 310, a second housing structure 320, a bracket assembly 340, a first rear cover 380, a second rear cover 390, and a hinge structure 510.

According to an embodiment, the display 200 may include a display panel (e.g., 200c in FIG. 6) (e.g., a flexible display panel) and one or more plates or layers (e.g., a support plate 240) on which a display panel 200b is seated. In an embodiment, the support plate 240 may be disposed between the display panel 200b and the bracket assembly 340. A bonding structure (not shown) is positioned between the support plate 240 and the bracket assembly 340, thereby being able to bond the support plate 240 and the bracket assembly 340.

According to an embodiment, the bracket assembly 340 may include a first support plate 410 and a second support plate 420. Between the first support plate 410 and the second support plate 420, the hinge structure 510 is disposed, and a hinge cover 330 covering the hinge structure 510 may be disposed when the hinge structure 510 is seen from the outside. As another embodiment, a Flexible Printed Circuit (FPC) may be disposed across the first support plate 410 and the second support plate 420.

According to an embodiment, the substrate assembly 520 may include a first main circuit board 521 disposed at the first support plate 410 and a second main circuit board 522 disposed at the second support plate 420. The first main circuit board 521 and the second main circuit board 522 may be disposed in a space defined by the bracket assembly 340, the first housing structure 310, the second housing structure 320, the first rear cover 380, and the second rear cover 390. Components for implementing various functions of the electronic device 101 may be mounted on the first main circuit board 521 and the second main circuit board 522.

According to an embodiment, the first housing structure 310 and the second housing structure 320 may be assembled to be coupled to both sides of the bracket assembly 340 with the display 200 coupled to the bracket assembly 340. For example, the first housing structure 310 and the second housing structure 320 may be combined with the bracket assembly 340 by sliding into both sides of the bracket assembly 340.

According to an embodiment, the first housing structure 310 may have a first surface 311 and a second surface 312 facing in the opposite direction to the first surface 311, and the second housing structure 320 may have a third surface 321 and a fourth surface 322 facing the opposite direction to the third surface 321.

According to an embodiment, the first housing structure 310 may have a first rotary support surface 313 and the second housing structure 320 may have a second rotary support surface 323 corresponding to the first rotary support surface 313. The first rotary support surface 313 and the second rotary support surface 323 may have a curved surface corresponding to the curved surface of the hinge cover 330.

According to an embodiment, when the electronic device 101 is in the unfolded state (the electronic device in FIG. 2), the first rotary support surface 313 and the second rotary support surface 323 cover the hinge cover 330, so the hinge cover 330 may not be exposed or may be minimally exposed on the rear surface of the electronic device 101. As another embodiment, when the electronic device 101 is in the folded state (the electronic device in FIG. 3), the first rotary support surface 313 and the second rotary support surface 323 are rotated along the curved surface of the hinge cover 330, so the hinge cover 330 may be maximally exposed on the rear surface of the electronic device 101.

Figure 5A:
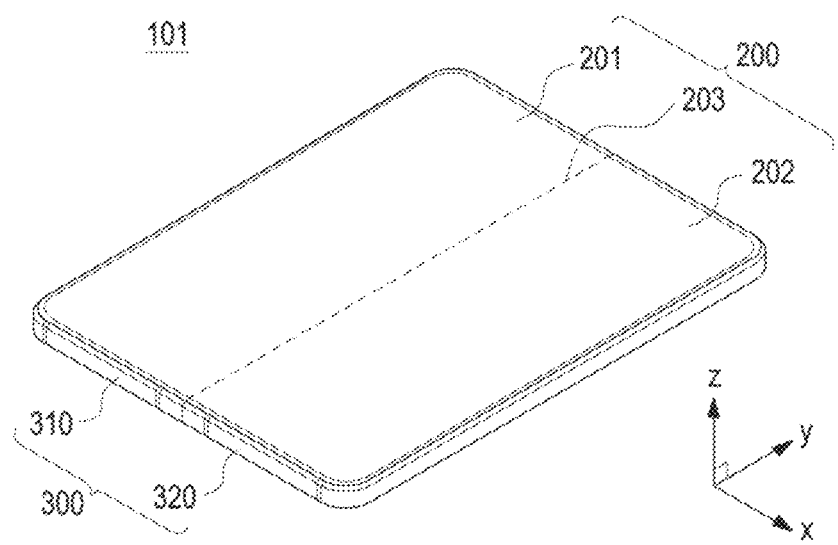
FIG. 5A is a perspective view showing an example of an unfolded electronic device 101 according to an embodiment.
Figure 5B:
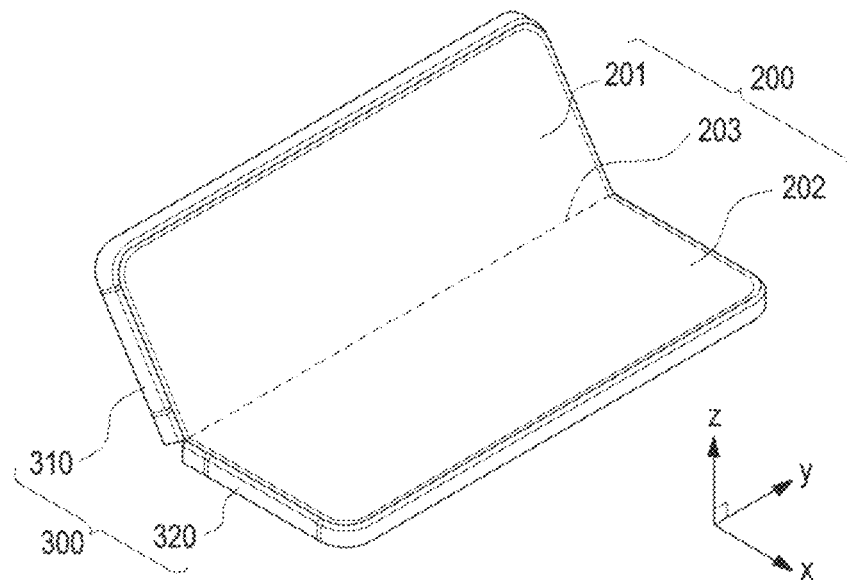
FIG. 5B is a perspective view showing an example of a partially folded electronic device 101 according to an embodiment.

FIG. 5A is a perspective view showing an example of an unfolded electronic device 101 according to an embodiment, and FIG. 5B is a perspective view showing an example of a partially folded electronic device 101 according to an embodiment.

Referring to FIGS. 5A and 5B, the electronic device 101 may include a foldable housing 300 and a flexible display 200. According to two different embodiments, the electronic device 101 may be an in-folding type or an out-folding type. The in-folding type may mean that the flexible display 200 is not exposed to the outside when folded. The out-folding type may mean that the flexible display 200 is exposed to the outside when fully folded. FIG. 5B shows an in-folding type. According to another embodiments, the electronic device 101 may be fully foldable in 360 degrees, and thus be both the in-folding type and the out-folding type.

In one example, the flexible display 200 may have a rectangular shape with rounded corners and a very narrow bezel.

The components of the electronic device 101 shown in FIGS. 1 to 4 may be the same or similar as those shown in FIG. 5.

The user can perform inputting using an input device (e.g., 150 in FIG. 1) on the first section 201, second section 202, and the third section 203 of the display 200.

Figure 6:
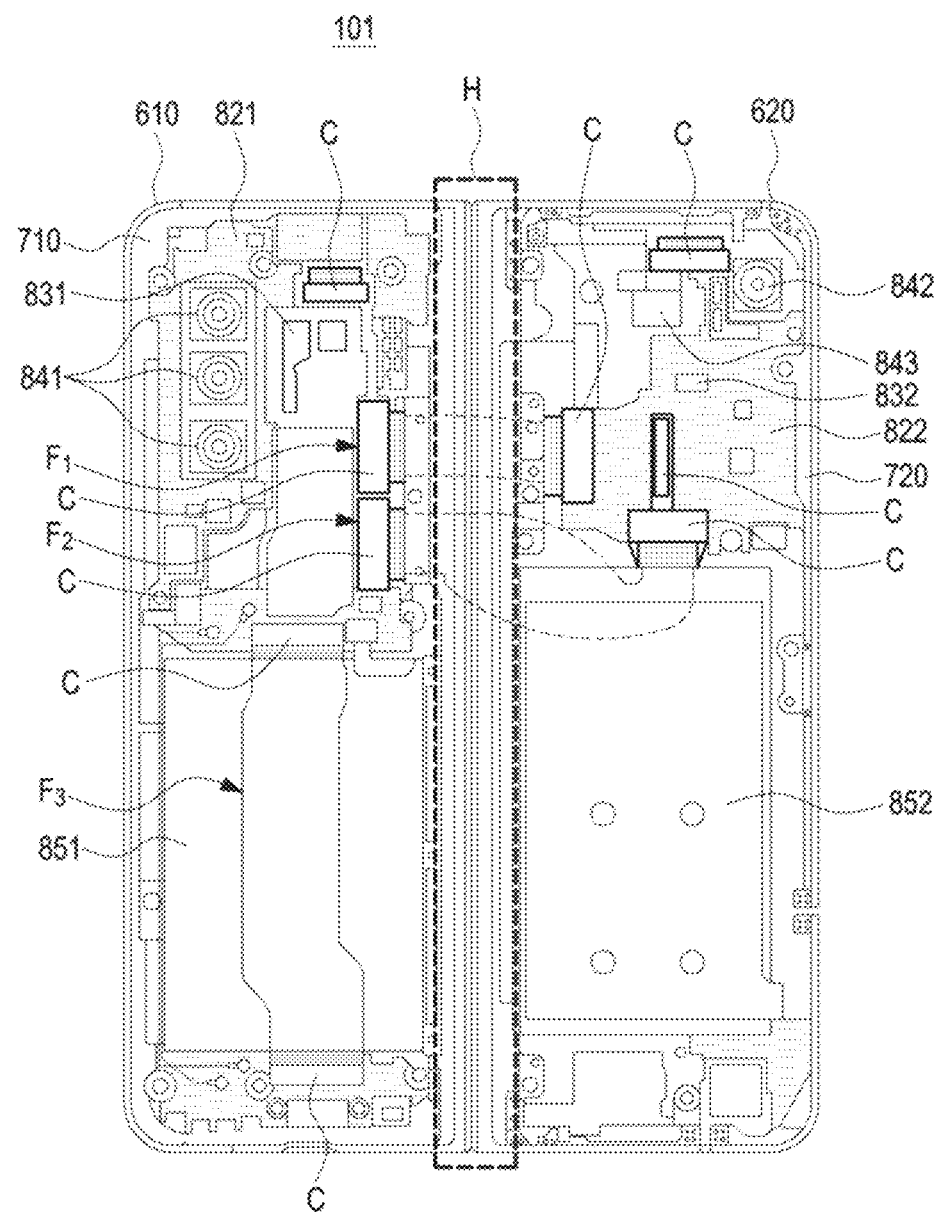
FIG. 6 is a plan view showing spatial relationships of components in the electronic device when unfolded, according to an embodiments.

FIG. 6 is a plan view showing spatial relationships of components in the electronic device when unfolded, according to an embodiments.

The electronic device 101 includes a foldable housing having a folding section H where the electronic device 101 may be folded about a folding axis. The foldable housing may include a first housing structure 610 and a second housing structure 620.

The foldable housing accommodates at least one printed circuit board, and according to an embodiment, a first printed circuit board 821 and a second printed circuit board 822 may be accommodated in the first housing structure 610 and the second housing structure 620, respectively. The structures of the printed circuit boards 821 and 822 shown in FIG. 6 may be partially or wholly the same as the structure of the circuit board 520 shown in FIG. 4.

According to an embodiment, the first printed circuit board 821 may be a main PCB including a processor 831 (e.g., a processor 120 in FIG. 1), a power management module (e.g., a PMIC, or a radio frequency transceiver. According to an embodiment, the second printed circuit board 822 may be a sub PCB equipped with a communication device 832. The communication device 832 may be a millimeter wave (mmWave) communication device that performs wireless communication in, for example, frequency bands over 20 GHz and under 100 GHz. According to an embodiment, the communication device 832 and the second printed circuit board 822 may be separate modules, unlike as shown in FIG. 6. According to an embodiment, the processor 831 may include at least a Communication Processor (CP) or may be a component formed by integrating an Application Processor (AP) and a CP, and can control or drive the radio frequency transceiver, the power management module, the wireless communication circuit, etc. The radio frequency transceiver may be included in the second printed circuit board 822, and can transmit/receive Rx digital signals, transmission analog I/Q signals, control signal, etc. to/from the processor 831. In an embodiment, the radio frequency transceiver can generate and provide communication signals to a wireless communication circuit.

According to an embodiment, the first printed circuit board 821 and the second printed circuit board 822 may be supported by a first support 710 disposed in the first housing structure 610 and a second support 720 disposed in the second housing structure 620, respectively. The first support 710 and the second support 720 can support the first printed circuit board 821 and the second printed circuit board 822, and can support other components (e.g., batteries 851 and 852) that are not mounted on the first printed circuit board 821 and the second printed circuit board 822.

According to an embodiment, various components (e.g., a first camera device 841) may be additionally disposed on the first printed circuit board 821, and various components (e.g., a second camera device 842 and a receiver module 843) may be disposed also on the second printed circuit board 822. It should be noted that the numbers and arrangement of various components are not limited to the embodiment shown in FIG. 6 in the instant disclosure and these components may be designed in various ways.

According to an embodiment, a plurality of connectors C for electrical connection (e.g., transmission of control signals, power, and communication signals) between the various components may be disposed on the first printed circuit board 821 and the second printed circuit board 822. The plurality of connectors C disposed on the first printed circuit board 821 and the second printed circuit board 822 may employ various types of connection structures (or connector structures) such as a Flexible Printed Circuit (FPC) or a Flexible Flat Cable (FFC) type, a Board-to-Board (B-to-B) type, a zip type, a bonding type formed for a hot bar process, a Low Insertion Force (LIF), and a Zero Insertion Force (ZIF), whereby relevant components can be electrically coupled.

In the electronic device 101 according to an embodiment, a Connector-To-Connector (C-to-C or C2C) type electrical connection structure (or connector structure) that connects two different connectors C may be used. C-to-C type electrical connection structures F1, F2, and F3 are shown as examples in FIG. 6.

The electronic device 101 according to an embodiment may include C-to-C type electrical connection structures F1 and F2 that connect connectors positioned on different printed circuit boards 821 and 822. The electrical connection structures F1 and F2 may be formed across at least a portion of the first printed circuit board 821 and at least a portion of the second printed circuit board 822. According to an embodiment, the electrical connection structures F1 and F2 may pass through at least a portion of the folding section of the hinge portion H and may be formed across at least a portion of the first printed circuit board 821 and at least a portion of the second printed circuit board 822. A Flexible Printed Circuit Board (FPCB) may be used to connect two connectors C disposed on different printed circuit boards. By using an FPCB, it is possible to stably achieve and/or maintain electrical connection between the connectors even if a printed circuit board is configured to be bent at least in some section.

The positions of the plurality of connectors C may be deigned in various ways, and the electrical connection structures connecting the plurality of connectors C may also be varied. It is required to generally consider the arrangement relationship and convenience of the spatial mounting of components when positioning the plurality of connectors C and determining the types of the electrical connection structures. For example, in order to mount the battery 852 having larger capacity in the electronic device 101, connectors and electrical connection structures for the connectors may be installed to bypass the area in which the battery 852 is mounted or may be installed to only partially overlap the area, as shown in FIG. 6.

Many signal lines may be formed and connected to the plurality of connectors and electrical connection structures. Some signal lines (e.g., Mobile Industry Processor Interface (MIPI)) may have a problem related with a signal loss which may be increased when the signal lines formed longer than a designated length, when the signal lines bent, or when other electronic components are disposed around the signal lines. Further, timing delay may occur and performance (e.g., antenna performance) may be deteriorated due to Electro Magnetic Interference (EMI) in the signal lines.

According to an embodiment, even if the electronic device 101 is equipped with a battery 852 having larger capacity, it is possible to provide a plurality of connectors and electrical connection structures for the connectors in order to prevent deterioration of performance.

According to an embodiment, by providing two different FPCBs F1 and F2 installed across portions of the first printed circuit board 821 and portions of the second printed circuit board 822, it is possible to design an interface in which a plurality of signal lines for performing various functions of the foldable electronic device 101 can be disposed. For example, the electronic device 101 may include a first FPCB F1 that crosses at least a portion of the first printed circuit board 821 and at least a portion of the second printed circuit board 822 and electrically connects the first printed circuit board 821 and the second printed circuit board 822 through connection terminals at both ends thereof. Further, the electronic device 101 may include a second FPCB F2 that crosses at least a portion of the first printed circuit board 821 and at least a portion of the second printed circuit board 822 and electrically connects first printed circuit board 821 and the second printed circuit board 822 through connection terminals at both ends thereof.

Signal lines having a first signal characteristic may be disposed on the first FPCB F1 and signal lines having a second signal characteristic may be disposed on the second FPCB F2. According to a certain embodiment, the FPCBs F1 and/or F2 may be formed at a predetermined length, capable of being bent, and disposed adjacent to a portion (hereafter, referred to as a 'loss area') of the first printed circuit board 821 and the second printed circuit board 822 in which other electronic components are disposed around the FPCB. According to an embodiment, when signal lines having a first signal characteristic are more sensitive than signal lines having a second signal characteristic, it is possible to improve integrity of the signals by disposing the second FPCB F2 adjacent to the loss area and the first FPCB F1 farther away from the loss area.

Figure 7A:
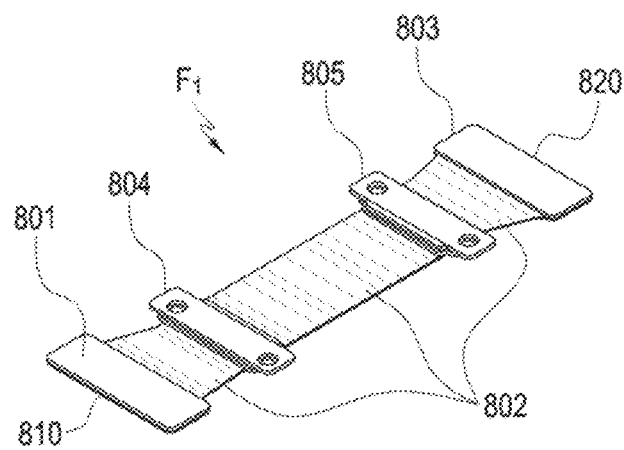
FIG. 7A is a perspective view of a flexible printed circuit board (e.g., a first flexible printed circuit board) according to an embodiment.
Figure 7B:
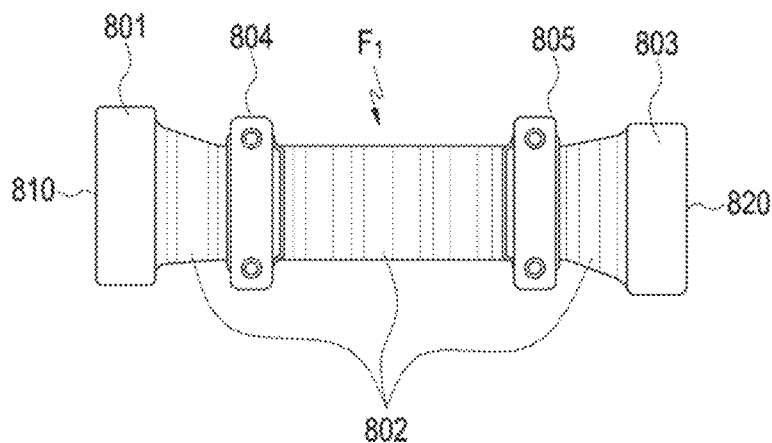
FIG. 7B is a front view of the flexible printed circuit board (e.g., the first flexible printed circuit board) according to an embodiment.
Figure 7C:
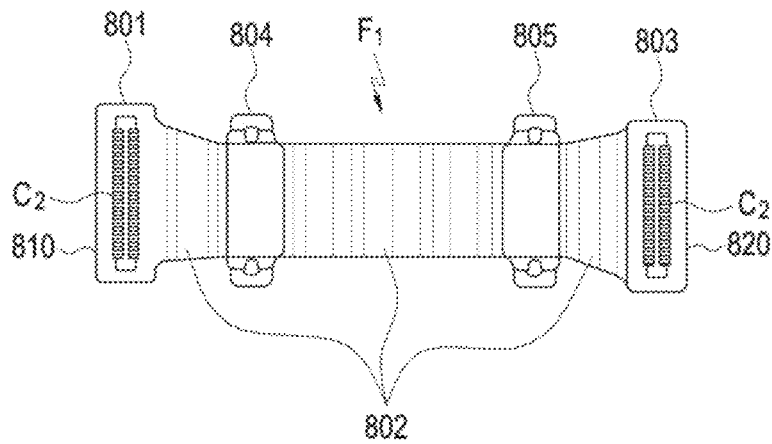
FIG. 7C is a rear view of the flexible printed circuit board (e.g., the first flexible printed circuit board) according to an embodiment.

FIG. 7A is a perspective view of a flexible printed circuit board (e.g., the first FPCB F1) according to an embodiment. FIG. 7B is a front view of the flexible printed circuit board (e.g., the first FPCB F1) according to an embodiment. FIG. 7C is a rear view of the flexible printed circuit board (e.g., the first FPCB F1) according to an embodiment.

The first FPCB F1 may include a component for connecting with at least one of a first printed circuit board (e.g., 821 in FIG. 6) or a second printed circuit board (e.g., 822 in FIG. 6). According to an embodiment, connection terminals 810 and 820 are formed at both ends of the FPCB F1, so the FPCB F1 can be connected to a first printed circuit board (e.g., 821 in FIG. 6) or a second printed circuit board (e.g., 822 in FIG. 6).

For example, the first FPCB F1 may have a first end 810 forming an end of the first FPCB and a second end 820 forming the other end as connection terminals 810 and 820, and rigid portions 801 and 803 for fixing to the first printed circuit board (e.g., 821 in FIG. 6) may be formed at the first end 810 and the second end 820. The rigid portions 801 and 803 may include a first rigid portion 801 and a rigid portion 803. The first connection terminal 810 is formed at the first rigid portion 801 and may include a plurality of pins C1 and a reinforcing material surrounding the plurality of pins C1. The second connection terminal 820 is formed at the second rigid portion 803 and may include a plurality of pins C2 and a reinforcing material surrounding the plurality of pins C2. The first connection terminal 810 may be a receptacle or a header that includes the plurality of pins C1 and the reinforcing material. Similarly, the second connection terminal 820 may be a receptacle or a header that includes the plurality of pins C2 and the reinforcing material. According to an embodiment, the plurality of pins C1 and C2 respectively formed on the rear surfaces of the first rigid portion 801 and the second rigid portion 803 may be respectively coupled to the connectors C disposed on the first printed circuit board 821 and the second printed circuit board 822 of the foldable electronic device 101.

According to an embodiment, the first rigid portion 801 and the second rigid portion 803 may have similar layers and structures. However, the disclosure is not necessarily limited thereto. Although the first rigid portion 801 and the second rigid portion 803 have a symmetric shape in the drawings, they are not necessarily limited thereto.

According to an embodiment, the first FPCB F1 may be a multi-layered circuit board in which several conductive layers and several insulating layers are alternately stacked. The first FPCB F1 may include at least one electrically conductive path connecting a first printed circuit board (e.g., 821 in FIG. 6) and a second printed circuit board (e.g., 822 in FIG. 6). For example, the conductive path may be formed on at least one of the several conductive layers and may transmit power or control signals provided from a power management module or a processor. In a certain embodiment, the first FPCB F1 may include a conductive path (e.g., an RF wiring) for transmitting communication signals provided from an RF transceiver or communication signal received through a communication device to a radio frequency transceiver. Such a conductive path(s) may also be formed on at least one of several conductive layers.

The first FPCB F1 may include a flex portion 802 between the first rigid portion 801 and the second rigid portion 803. According to various embodiments, the first rigid portion 801 and the flex portion 802 each may include a plurality of conductive layer and a plurality of insulating layer that are separated from each other, and the conductive layers and insulating layers may integrally extend from the first rigid portion 801 and the flex portion 802. The insulating layer may be Polyimide (PI)-based base material layer such as a Flexible Copper Clad Laminate (FCCL) and the conductive layers may be obtained by forming a thin metal plate (e.g., copper (Cu)) and/or plate a thin cooper layer at least on one surface of a Polyimide (PI)-based base material layer.

According to an embodiment, the first FPCB F1 may further include at least one rigid portion between the first end 810 and the second end 820. According to the embodiment shown in FIGS. 7A to 7C, the first FPCB F1 may further include two rigid portions 804 and 805. The first FPCB F1 of the disclosure is disposed through the folding section of the hinge portion H in a foldable electronic device (e.g., 101 in FIG. 6), so it is possible to provide a more stable coupling structure to a housing for the first FPCB F1 by additionally including at least one rigid portion.

Figure 8:
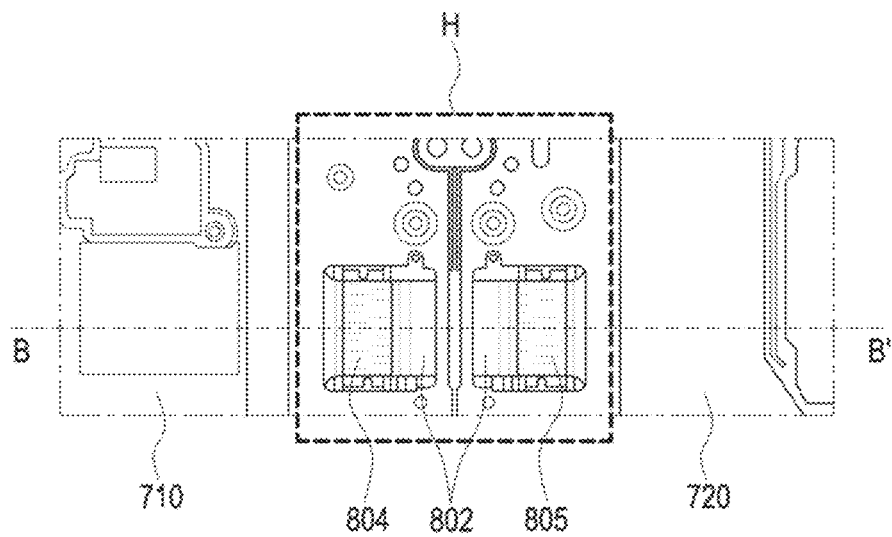
FIG. 8 is a plan view showing when the first flexible printed circuit board is mounted on a hinge portion of the electronic device according to an embodiment.
Figure 9:
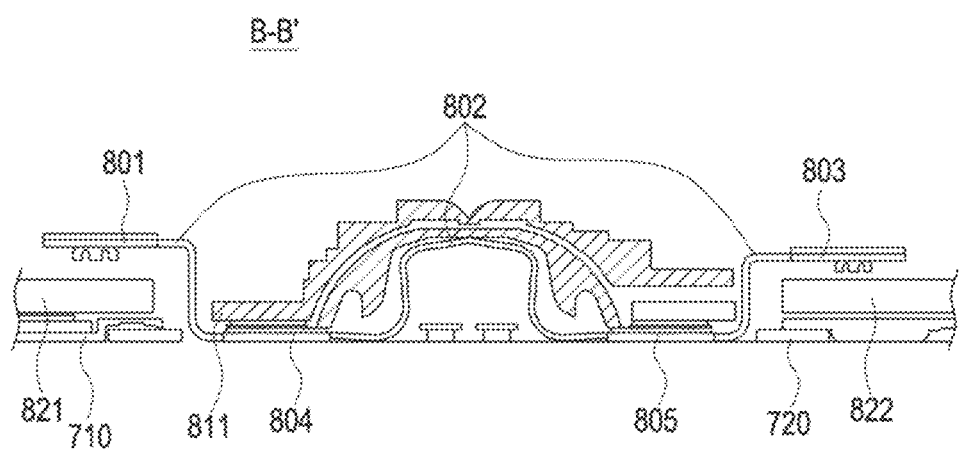
FIG. 9 is a side view showing a cross-section taken along line B-B' of the foldable electronic device according to the embodiments shown in FIG. 8.

FIG. 8 is a plan view showing when the first FPCB F1 is mounted on the hinge portion H1 of a foldable electronic device (e.g., 101 in FIG. 6) according to an embodiment. FIG. 9 is a side view showing a cross-section taken along line B-B' of the foldable electronic device (e.g. 101 in FIG. 6) according to the embodiments shown in FIG. 8.

Referring to FIGS. 8 and 9, the first FPCB F1 can be combined with a hinge module of the foldable electronic device between the first support 710 and the second support 720. The first FPCB F1 has two rigid portions 801 and 803 at both ends and a flex portion 802 between the rigid portions. The flex portion 802 formed between the first rigid portion 801 and the second rigid portion 803 may bend with a predetermined curvature and may be disposed such that a least a portion is surrounded from the hinge structure 811.

The first rigid portion 801 may be disposed in a first housing structure (e.g., 610 in FIG. 6) of the foldable electronic device, and as shown in FIG. 9, may be mounted to face the first printed circuit board 821 in the first housing structure (e.g., 610 in FIG. 6). The second rigid portion 803 may be disposed in a second housing structure (e.g., 620 in FIG. 6) of the foldable electronic device, and as shown in FIG. 9, may be mounted to face the second printed circuit board 822 in the second housing structure (e.g., 620 in FIG. 6).

The first FPCB F1 may further have two rigid portions 804 and 805 to be stably combined with the housing, and the two rigid portions 804 and 805 may be fixed to a partial surface of the hinge structure 811. As shown in FIG. 8, according to an embodiment, the two rigid portions 804 and 805 may be exposed when the display is removed from the electronic device (e.g., 101 in FIG. 6).

Figure 10:
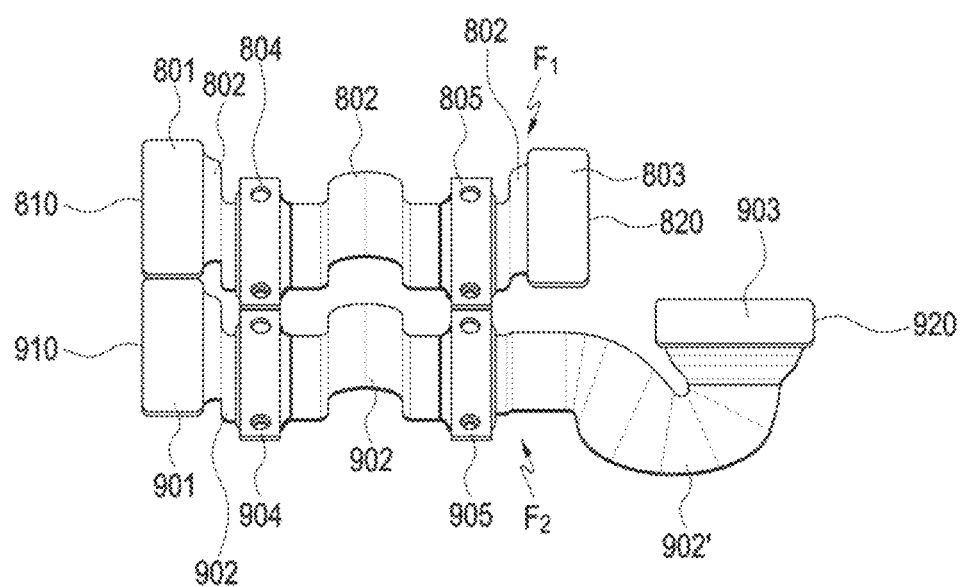
FIG. 10 is a view showing a first flexible printed circuit board and a second flexible printed circuit board according to an embodiment.

FIG. 10 is a view showing the first FPCB F1 and the second FPCB F2 according to an embodiment.

According to an embodiment, the second FPCB F2 has a third end 910 forming an end of the second FPCB F2 and a fourth end 920 forming the other end as connection terminals, and rigid portions 901 and 903 for fixing to the first and second printed circuit boards may be formed at the third end 910 and the fourth end 920. The second FPCB F2 according to an embodiment may have a flex portion 902 formed between the third rigid portion 901 and the fourth rigid portion 903. The second FPCB F2 according to an embodiment additionally has at least one rigid portion 904 and 905 between the third end 910 and the fourth end 920, and the rigid portions 904 and 905 may be connected and fixed to a hinge structure (e.g., 811 in FIG. 9). The above description about the first FPCB F1 referring to FIGS. 7A to 9 may be used for the second FPCB F2.

Hereafter, differences between the first FPCB F1 and the second FPCB F2 may be described.

Referring to FIG. 10, the second FPCB F2 may be longer than the first FPCB F1. According to an embodiment, a portion 902' of the flex portion of the second FPCB F2 is elongated, whereby a signal line longer than the first FPCB F1 may be formed. For example, when signal lines longer than the first FPCB F1 are needed, depending on the internal mounting environment of the foldable electronic device, signal lines disposed on the second FPCB F2 are grouped as signal lines having signal characteristics less sensitive than signal lines disposed on the first FPCB F1. Therefore, even when the signal lines of the second FPCB F2 have increased lengths, interference is minimized.

According to an embodiment, at least portions (e.g., 901, 902, 903, 904, and 905) of the second FPCB F2 may be disposed in parallel with the first FPCB F1, and at least a portion of the second FPCB F2 may form a bent portion (e.g., 902') not in parallel with the first FPCB F1. Referring to FIGS. 6 and 10, in the electronic device 101 according to an embodiment, at least a portion (e.g., 902') of the second FPCB F2 may overlap with electronic components such as the battery. The signal lines disposed on the second FPCB F2 are grouped as signal lines having signal characteristics less sensitive than the signal lines disposed on the first FPCB F1, such that interference is minimized.

Referring to FIGS. 6 and 10, according to an embodiment, while the first end 810 and the second end 820 of the first FPCB F1 may be disposed to face opposite directions to each other in the electronic device (e.g., 101 in FIG. 6), the third end 901 and the fourth end 920 of the second FPCB F2 may be disposed to face perpendicular directions to each other.

Figure 11:
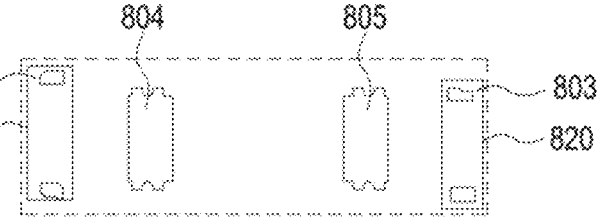
FIG. 11 is schematic diagrams showing circuits disposed on each layer when the first flexible printed circuit board according to an embodiment includes a plurality of layers.
Figure 12:
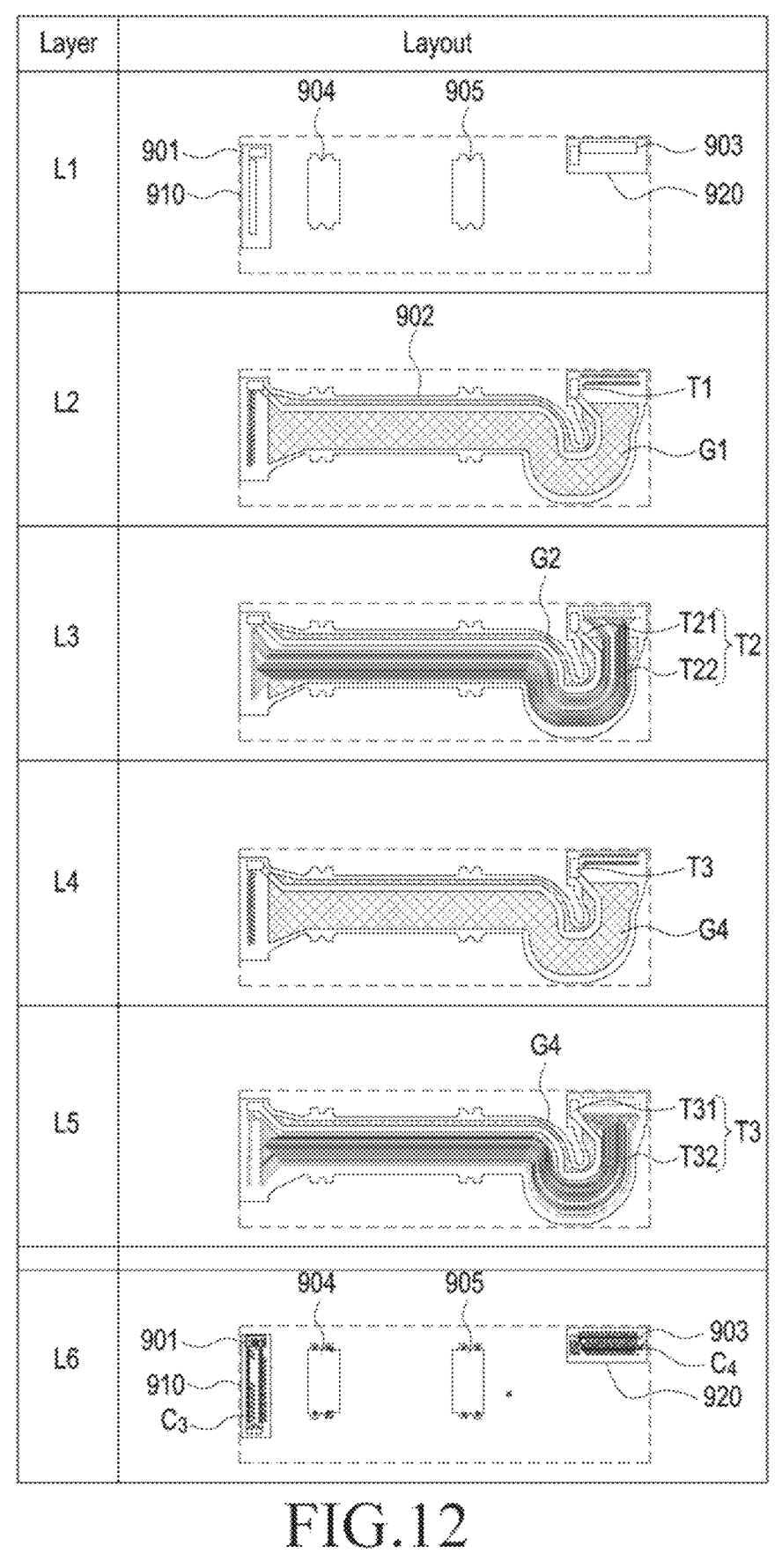

FIG. 11 is schematic diagrams showing circuits disposed on each layer when the first FPCB F1 according to an embodiment includes a plurality of layers. FIG. 12 is schematic diagrams showing circuits disposed on each layer when the second FPCB F2 according to an embodiment includes a plurality of layers.

Referring to FIG. 11, the first FPCB F1 may be a multi-layered circuit board including a plurality of layers, for example, six layers L1, L2, L3, L4, L5, and L6. Obviously, it should be noted that the embodiment shown in FIG. 11 does not limit the instant disclosure. For example, according to another embodiment, it may be possible to include five layers, and according to yet another embodiment, it may be possible to include seven or more layers.

Referring to FIG. 11, signal lines S1, S2, and S3 that are sensitive to length, width, and interference by other surrounding adjacent electronic components may be disposed on the first FPCB F1. For example, when a signal line for Mobile Industry Processor Interface (MIPI) used for high-speed communication to control and drive display and camera is overly long, it is difficult to maintain the impedance of the signal line. Thus, such a MIPI signal line should be formed on the first FPCB F1. As another example, when power wiring to which a high current is applied is overly long, voltage drop may occur that may cause the electronic device (e.g. 101 in FIG. 6) to turn off. Accordingly, this power wiring should also be disposed on the first FPCB F1 on which as short signal lines as possible can be formed. According to another embodiment, signal lines having sensitive signal characteristics such as wireless charging/NFC lines may be disposed on the first FPCB F1.

According to an embodiment, rigid portions 801, 803, 804, and 805 may be formed on a first layer L1 and a second layer L6 of the first FPCB F1, and the flex portion 802 may be formed on a second layer L2, a third layer L3, a fourth layer L4, and a fifth layer L5 of the first FPCB F1. According to an embodiment, signal lines may be formed on at least any one of the second layer L2, the third layer L3, the fourth layer L4, and the fifth layer L5.

According to an embodiment, an MIPI signal line S3 for performing high-speed communication (e.g., a first-first signal line) may be formed on the fifth layer L5 that is close to a plurality of pins C1 and C2. In this case, there may be an advantage in that the size of via and the length of wirings are minimized and it is possible to minimize communication loss. According to an embodiment, a power wiring (e.g., a system power wiring) (e.g., a first-second signal line) S1 may be disposed on the second layer L2 closest to the first layer L1. When the high-speed communication signal MIPI S3 is formed on the fifth layer L5, it is possible to minimize the noise between the power wiring S1 and the MIPI wiring S3 by disposing them as far away from each other as possible.

According to an embodiment, at least one layer having grounds G1 and G2 may be provided between the high-speed communication signal line S3 and the power wiring line S1. According to an embodiment, it is possible to dispose another power wiring (e.g., battery power wiring S1) away from the high-speed communication signal line S3 by disposing the power wiring on the layer L3 adjacent to the layer L2 on which the system power line S1 is formed.

According to an embodiment, it is possible to form an electromagnetic shield structure by forming an anti-EMI film to prevent EMI. For example, it is possible to form an electromagnetic shield structure by disposing an anti-EMI film to surround at least portions of the fifth layer on which the high-speed communication signal line S3 and the second layer on which the power wiring (e.g., system power wiring) S1 is disposed.

Referring to FIG. 12, signal lines (e.g., T1, T2, and T3) that are less sensitive to length, width, and interference by other surrounding adjacent electronic components may be disposed on the second FPCB F2. For example, an I2C for low-speed communication may be disposed on the second FPCB F2. As other examples, power wirings of RCV, interrupt, motor, and proximity sensor may be formed on the second FPCB F2.

According to an embodiment, wiring for a main battery may be disposed on the first FPCB F1 and wiring for a sub battery may be disposed on the second FPCB F2.

The second FPCB F2 according to an embodiment may also include at least one via. A ground may be formed on at least some of the plurality of conductive layers of the second FPCB F2.

Figure 13A:
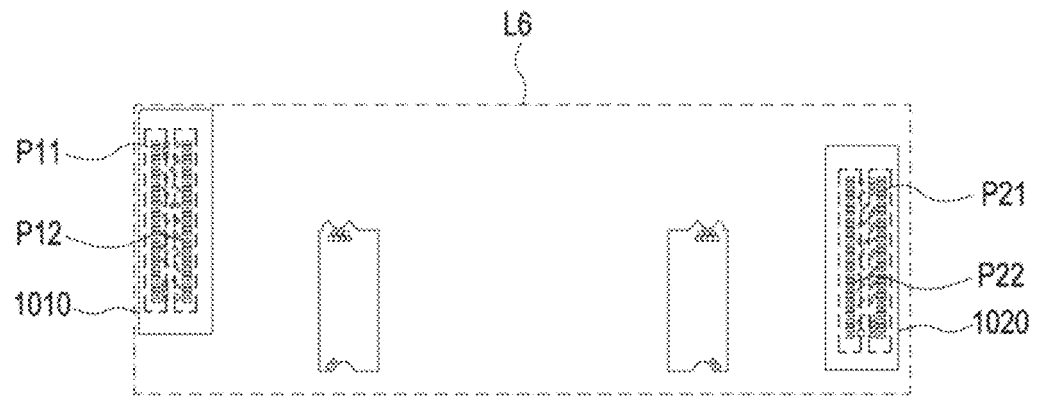
FIG. 13A is a schematic diagram showing a layer having a plurality of pins when a flexible printed circuit board (e.g., the first flexible printed circuit board) according to an embodiment includes a plurality of layers.
Figure 13B:
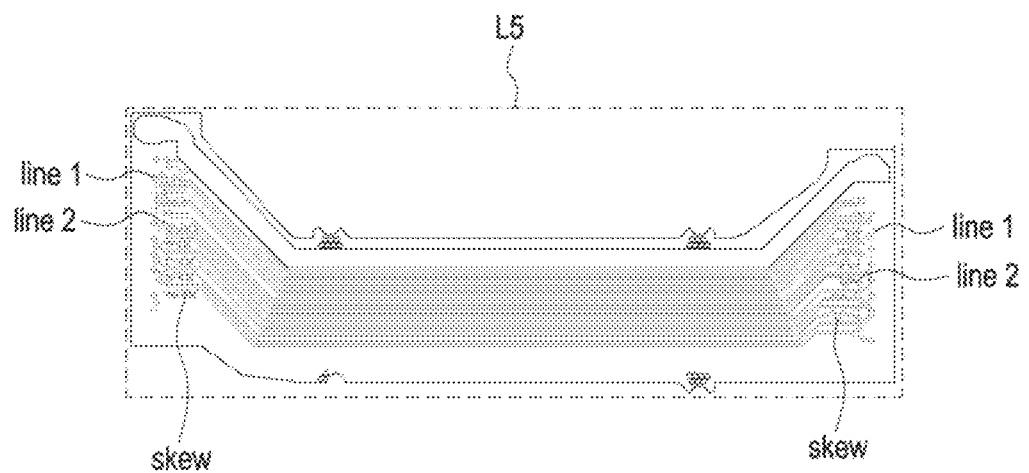
FIG. 13B is a schematic diagram showing a layer having a signal line that can perform high-speed communication when a flexible printed circuit board (e.g., the first flexible printed circuit board) according to an embodiment includes a plurality of layers.

FIG. 13A is a schematic diagram showing a layer L6 having a plurality of pins when a flexible printed circuit board (e.g., the first FPCB F1) according to an embodiment includes a plurality of layers. FIG. 13B is a schematic diagram showing a layer L5 having a signal line that can perform high-speed communication when a flexible printed circuit board (e.g., the first FPCB F1) according to an embodiment includes a plurality of layers.

According to an embodiment, the first FPCB F1 may include a layer L6 having a first connector at an end 1010 and a second connector corresponding to the first connector at the other end 1020. The first connector and the second connector may include parallel pin connectors each having at least two lines of pins P11 and P12 and P21 and P22.

Referring to FIG. 13A, in the electronic device according to an embodiment (e.g., 101 in FIG. 6), the first connector may have a first-first pin P11 formed at the outermost side of the first FPCB F1 and a first-second pin P12 formed inside the first-first pin P11. The second connector may have a second-first pin P21 formed at the outermost side of the first FPCB F1 and a second-second pin P22 formed inside the second-first pin P21.

Referring to FIG. 13B, signals lines (e.g., MIPI signal lines) corresponding to the parallel pins shown in FIG. 13A are shown. The line 1 may be a signal line disposed at a position corresponding to the first-first pin P11 and the second-first pin P21 of the first connector and the line 2 may be a signal line disposed at a position corresponding to the first-second in P12 and the second-second pin P22 of the first connector.

According to the embodiment shown in FIGS. 13A and 13B, an embodiment having an out-out wiring structure connected with signal lines (e.g., the line 1) corresponding to the pin formed at the outermost side of a connector and an in-in wiring structure connected with signal lines (e.g., the line 2) corresponding to the pins formed inside the connector may be shown. According to an embodiment, the out-out wiring structure may have a larger wiring length than the in-in wiring structure. Accordingly, the arrival time of data transmitted to the out-out wiring structure may be larger than the arrival time of data transmitted to the in-in wiring structure (timing skew). According to an embodiment, it may be considered to elongate the in-in wiring section such that the arrival time of data transmitted to the in-in wiring section is close to the arrival time of data transmitted to the out-out wiring section, and to this end, an end of the in-in wire may be formed at least partially have a skew shape.

Figure 14A:
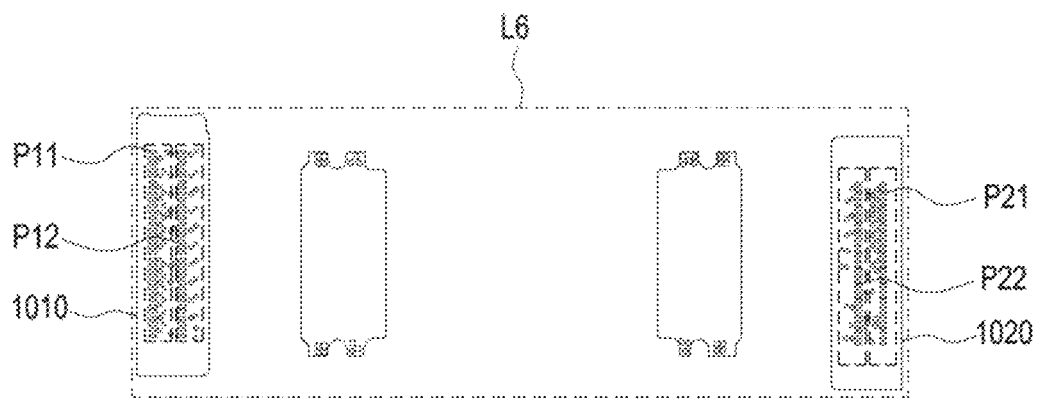
FIG. 14A is a schematic diagram showing layers having a plurality of pins when a flexible printed circuit board (e.g., the first flexible printed circuit board) according to an embodiment includes a plurality of layers.
Figure 14B:
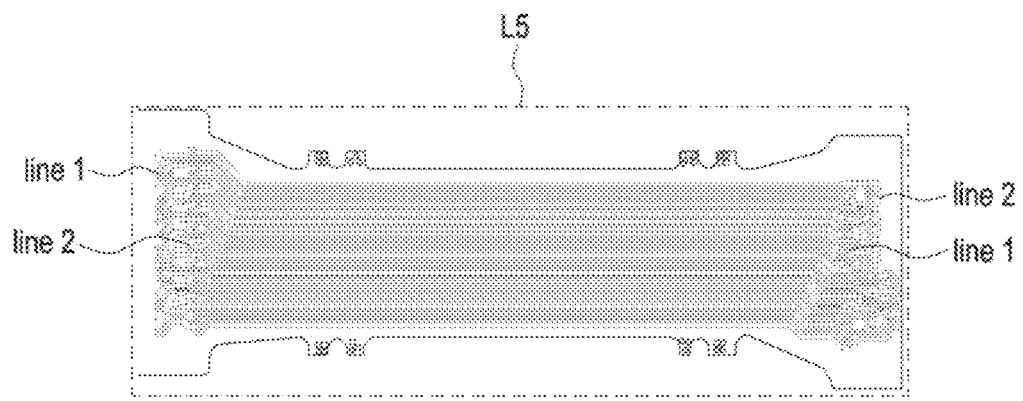
FIG. 14B is a schematic diagram showing layers having a signal line that can perform high-speed communication when a flexible printed circuit board (e.g., the first flexible printed circuit board) according to an embodiment includes a plurality of layers.

FIG. 14A is a schematic diagram showing a layer L6 having a plurality of pins when a flexible printed circuit board (e.g., the first FPCB F1) according to an embodiment includes a plurality of layers. FIG. 14B is a schematic diagram showing a layer L5 having a signal line that can perform high-speed communication when a flexible printed circuit board (e.g., the first FPCB F1) according to an embodiment includes a plurality of layers.

According to an embodiment, the first FPCB F1 may include a layer L6 having a first connector at an end 1010 and a second connector corresponding to the first connector at the other end 1020. The first connector and the second connector may be parallel pin connectors each having at least two lines of pins P11 and P12 and P21 and P22.

Referring to FIG. 14A, in the same way as the embodiment shown in FIG. 13A, the first connector may have a first-first pin in P11 formed at the outermost side of the first FPCB F1 and a first-second pin P12 formed inside the first-first pin P11 and the second connector may include a second-first pin P21 formed at the outermost side of the first FPCB F1 and a second-second pin P22 formed inside the second-first pin P21.

Referring to FIG. 14B, signals lines (e.g., MIPI signal lines) corresponding to the parallel pins shown in FIG. 14A are shown. The line 1 may be a signal line disposed at a position corresponding to the first-first pin P11 and the second-second pin P22 of the first connector and the line 2 may be a signal line disposed at a position corresponding to the first-second pin in P12 and the second-first pin P21 of the first connector.

Signal lines according to the embodiment shown in FIGS. 14A and 14B may show an embodiment having an out-in wiring (e.g., line 1) and an in-out wiring structure (e.g., line 2). According to this embodiment, there is an advantage in that line 1 and line 2 may have approximately the same lengths and the wiring may be easy. When the lengths of line 1 and line 2 are close, it is possible to minimize timing skew and minimize inter-signal delay. Further, when line 1 and line 2 having close lengths are included, there may be no need for an additional wiring for reducing the timing skew or delay.

An electronic device according to various embodiments disclosed herein may be various types of devices. The electronic devices may include, for example, a portable communication device (e.g., a smart phone), a computer device, a portable multimedia device, a portable medical device, a camera, a wearable device, or a home appliance. According to an embodiment, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," or "connected with,", it means that the element may be coupled with the other element directly (e.g., wiredly), wirelessly, or via a third element.

According to various embodiments, each component (e.g., a module or a program) of the above-described components may include a single entity or multiple entities. According to various embodiments, one or more components of the above-described components or operations may be omitted, or one or more other components or operations may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, there may be provided an electronic device (e.g. 101 in FIG. 4), in which a foldable housing includes a hinge structure (e.g., 510 in FIG. 4) having a folding axis, and a folding section where the electronic device is folded about the folding axis, a first housing structure (e.g., 610 in FIG. 6) connected to the hinge structure, having a first surface (e.g., 311 in FIG. 4) facing a first direction and a second surface (e.g., 312 in FIG. 4) facing a second direction opposite to the first direction, and including a first printed circuit board (e.g., 821 in FIG. 6) having a plurality of electronic components mounted thereon; and a second housing structure (e.g., 620 in FIG. 6) connected to the hinge structure, having a third surface (e.g. 321 in FIG. 4) facing a third direction and a fourth surface (e.g., 322 in FIG. 4) facing a fourth direction opposite to third direction, including a second printed circuit board (e.g., 822 in FIG. 6) having a plurality of electronic components mounted thereon. The second housing structure is configured to be foldable on the first housing structure around the hinge structure. The electronic device further includes: a flexible display (e.g., 200 in FIG. 4) disposed in the foldable housing and extending from the first surface of the first housing structure to the third surface of the second housing structure; a first flexible printed circuit board (e.g., F1 in FIG. 6) crossing at least a portion of the hinge structure and electrically connecting the first printed circuit board and the second printed circuit board through connection terminals at both ends thereof; and a second flexible printed circuit board (e.g., F2 in FIG. 6) crossing at least a portion of the hinge structure and electrically connecting the first printed circuit board and the second printed circuit board through connection terminals at both ends thereof, in which signal lines (e.g., S1, S2, and S3 in FIG. 11) having a first signal characteristic are disposed on the first flexible printed circuit board and signal lines (e.g., T1, T2, and T3 in FIG. 12) having a second signal characteristic are disposed on the second flexible printed circuit board.

According to an embodiment, the second flexible printed circuit board may be formed longer than the first flexible printed circuit board.

According to an embodiment, at least a portion of the second flexible printed circuit board may be parallel with the first flexible printed circuit board, and at least another portion of the second flexible printed circuit board may not be parallel with the first flexible printed circuit board and may have a bent portion (e.g., 902' in FIG. 10).

According to an embodiment, the other portion of the second flexible printed circuit board may overlap the plurality of electronic components.

According to an embodiment, the other portion of the second flexible printed circuit board may overlap a battery (852 in FIG. 6).

According to an embodiment, the first connection terminals may be disposed at a first end (e.g. 810 in FIG. 10) and a second end (e.g. 820 in FIG. 10) of the first flexible printed circuit board, first rigid portions (e.g. 801 and 803 in FIG. 10) for fixing the first flexible printed circuit board to the first printed circuit board and the second printed circuit board may be formed at the first end and the second end, the second connection terminals may be disposed at a third end (e.g. 910 in FIG. 10) and a fourth end (e.g. 920 in FIG. 10) of the second flexible printed circuit board, and second rigid portions (e.g. 901 and 903 in FIG. 10) for fixing the second flexible printed circuit board to the first printed circuit board and the second printed circuit board may be formed at the third end and the fourth end.

According to an embodiment, the first end and the second end may face opposite directions, and the third end and the fourth end may face directions perpendicular to each other.

According to an embodiment, the first flexible printed circuit board may further have at least one third rigid portion (e.g., 804 and 805 in FIG. 10) between the first end and the second end, and the second flexible printed circuit board may further have at least one rigid fourth portion (904 and 905 in FIG. 10) between the third end and the fourth end.

According to an embodiment, the at least one third rigid portion and the at least one fourth rigid portion may be configured to be connected and fixed to the hinge structure.

According to an embodiment, the first signal lines may be signal lines that perform communication at a relatively higher speed than the second signal lines or may be signal lines through which a relatively higher current flows.

According to an embodiment, the first flexible printed circuit board may include a first-first signal line (e.g., S1 in FIG. 11) and a first-second signal line (e.g., S3 in FIG. 11) disposed on different layers, and a ground (e.g., G1 and/or G2 in FIG. 11) between the first-first signal line and a layer having the first-second signal line.

According to an embodiment, the first flexible printed circuit board may include a layer (e.g., L6 in FIG. 11) having a first connector (e.g., C1 in FIG. 11) formed at an end and a second connector (e.g., C2 in FIG. 11) corresponding to the first connector and formed at the other end, in which the first connector and the second connector may be parallel pin connectors each having at least two lines of pins.

According to an embodiment, the first connector may have a first-first line of pins (e.g., P11 in FIG. 14A) formed at the outermost side of the first flexible printed circuit board and a first-second line of pins (e.g., P12 in FIG. 14A) formed inside the first-first line of pins, the second connector may have a second-first line of pins (e.g., P21 in FIG. 14A) formed at the outermost side of the first flexible printed circuit board and a second-second line of pins (e.g., P22 in FIG. 14A) formed inside the second-first line of pins. The first flexible printed circuit board may further include a first signal line (e.g. line 1 in FIG. 14B) connected from the first-first line of pins (e.g., P11 in FIG. 14A) to the second-second line of pins (e.g., P22 in FIG. 14A), and a second signal line connected from the first-second line of pins (e.g., P12 in FIG. 14A) to the second-first line of pins (e.g., P21 in FIG. 14A).

According to an embodiment, a layer (e.g., L5 in FIG. 14B) on which the first signal line and the second signal line is disposed may be stacked adjacent to a layer (e.g., L6 in FIG. 14A) having the first connector and the second connector.

According to an embodiment, the first signal line (e.g., line 1 in FIG. 14B) and the second signal line (e.g., line 2 in FIG. 14B) each may correspond to a Mobile Industry Processor Interface (MIPI).

According to an embodiment, an electronic device (e.g., 101 in FIG. 6) includes: a housing: a first printed circuit board (e.g., 821 in FIG. 6) disposed in the housing; a second printed circuit board (e.g., 822 in FIG. 6) disposed in the housing and spaced apart from the first printed circuit board; a first flexible printed circuit board (e.g., F1 in FIG. 6) electrically connecting the first printed circuit board and the second printed circuit board; and a second flexible printed circuit board (e.g., F2 in FIG. 6) electrically connecting the first printed circuit board and the second printed circuit board, in which the second flexible printed circuit board may be longer than the first flexible printed circuit board.

According to an embodiment, at least a portion of the second flexible printed circuit board may be disposed in parallel with the first flexible printed circuit board.

According to an embodiment, first signal lines may be disposed on the first flexible printed circuit board and second signal lines different in signal characteristic from the first signal lines may be disposed on the second flexible printed circuit board.

According to an embodiment, the first connector may have a first-first line of pins (e.g., P11 in FIG. 14A) formed at the outermost side of the first flexible printed circuit board and a first-second line of pins (e.g., P12 in FIG. 14A) formed inside the first-first line of pins, the second connector may have a second-first line of pins (e.g., P21 in FIG. 14A) formed at the outermost side of the first flexible printed circuit board and a second-second line of pins (e.g., P22 in FIG. 14A) formed inside the second-first line of pins. The first flexible printed circuit board may further include a first signal line (e.g. line 1 in FIG. 14B) connected from the first-first line of pins (e.g., P11 in FIG. 14A) to the second-second line of pins (e.g., P22 in FIG. 14A), and a second signal line (e.g., line 2 in FIG. 13B) connected from the first-second line of pins (e.g., P12 in FIG. 14A) to the second-first line of pins (e.g., P21 in FIG. 14A).

According to an embodiment, the first signal line (e.g., line 1 in FIG. 14B) and the second signal line (e.g., line 2 in FIG. 14B) may correspond to a Mobile Industry Processor Interface (MIPI).

While the disclosure has been shown and described with reference to certain embodiments thereof, it will be understood by those skilled in the art that various changes in form and details may be made therein without departing from the spirit and scope of the disclosure as defined by the appended claims.

What is claimed is:

1. A foldable electronic device comprising: a hinge structure having a folding axis; a foldable housing including a folding section where the electronic device is folded about the folding axis, a first housing structure, and a second housing structure, wherein: the first housing structure is connected to the hinge structure, includes a first surface facing a first direction, a second surface facing a second direction opposite to the first direction, and a first printed circuit board having a first plurality of electronic components mounted thereon, the second housing structure is connected to the hinge structure, includes a third surface facing a third direction, a fourth surface facing a fourth direction opposite to the third direction, and a second printed circuit board having a second plurality of electronic components mounted thereon, the second housing structure being configured to be foldable with respect to the first housing structure around the hinge structure, and the first surface faces the third surface when the electronic device is folded and the third direction coincides with the first direction when the electronic device is unfolded; a flexible display disposed in the foldable housing as extended under the first surface of the first housing structure and the third surface of the second housing structure; a first flexible printed circuit board disposed to cross a portion of the hinge structure, and configured to electrically connect the first printed circuit board and the second printed circuit board through first connection terminals at both ending portions thereof; and a second flexible printed circuit board disposed to cross another portion of the hinge structure, and configured to electrically connect the first printed circuit board and the second printed circuit board through second connection terminals at both ending portions thereof, wherein first signal lines having a first signal characteristic are disposed on the first flexible printed circuit board, and second signal lines having a second signal characteristic are disposed on the second flexible printed circuit board, wherein the first flexible printed circuit board further comprises a layer having a first connector formed at an ending portion thereof, and a second connector corresponding to the first connector and formed at another ending portion thereof, and the first connector and the second connector are parallel pin connectors each having at least two lines of pins.

2. The foldable electronic device of claim 1, wherein the second flexible printed circuit board is longer than the first flexible printed circuit board.

3. The foldable electronic device of claim 1, wherein a portion of the second flexible printed circuit board is parallel with the first flexible printed circuit board, and another portion of the second flexible printed circuit board is not parallel with the first flexible printed circuit board and includes a bent portion.

4. The foldable electronic device of claim 3, wherein the other portion of the second flexible printed circuit board overlaps the first plurality of electronic components or the second plurality of electronic components.

5. The foldable electronic device of claim 3, wherein the other portion of the second flexible printed circuit board overlaps a battery.

6. The foldable electronic device of claim 1, wherein:
the first connection terminals are disposed at a first ending portion and a second ending portion of the first flexible printed circuit board,
first rigid portions for fixing the first flexible printed circuit board to the first printed circuit board and the second printed circuit board are formed at the first ending portion and the second ending portion,
the second connection terminals are disposed at a third ending portion and a fourth ending portion of the second flexible printed circuit board, and
second rigid portions for fixing the second flexible printed circuit board to the first printed circuit board and the second printed circuit board are formed at the third ending portion of and the fourth ending portion.

7. The foldable electronic device of claim 6, wherein the first ending portion and the second ending portion face opposite directions, and the third ending portion and the fourth ending portion face directions perpendicular to each other.

8. The foldable electronic device of claim 6, wherein the first flexible printed circuit board further comprises at least one third rigid portion between the first ending portion and the second ending portion, and
the second flexible printed circuit board further comprises at least one fourth rigid portion between the third ending portion and the fourth ending portion.

9. The foldable electronic device of claim 8, wherein the at least one third rigid portion and the at least one fourth rigid portion are configured to be connected and fixed to the hinge structure.

10. The foldable electronic device of claim 1, wherein the first signal lines are signal lines that perform communication at a relatively higher speed than the second signal lines or are signal lines through which a relatively higher current than the second signal lines flows.

11. The foldable electronic device of claim 1, wherein the first flexible printed circuit board further comprises a first-first signal line and a first-second signal line disposed on different layers, and a ground between the first-first signal line and the first-second signal line.

12. The foldable electronic device of claim 1, wherein the first connector further comprises a first-first line of pins formed at an outermost side of the first flexible printed circuit board and a first-second line of pins formed inside the first-first line of pins, the second connector further comprises a second-first line of pins formed at the outermost side of the first flexible printed circuit board and a second-second line of pins formed inside the second-first line of pins, and
wherein the first flexible printed circuit board further comprises a first signal line connected from the first-first line of pins to the second-second line of pins, and a second signal line connected from the first-second line of pins to the second-first line of pins.

13. The foldable electronic device of claim 12, wherein a layer on which the first signal line and the second signal line is disposed is stacked adjacent to a layer having the first connector and the second connector.

14. The foldable electronic device of claim 12, wherein the first signal line and the second signal line each correspond to a Mobile Industry Processor Interface (MIPI).

15. An electronic device comprising: a housing; a first printed circuit board disposed in the housing; a second printed circuit board disposed in the housing and spaced apart from the first printed circuit board; a first flexible printed circuit board configured to electrically connect the first printed circuit board and the second printed circuit board; and a second flexible printed circuit board configured to electrically connect the first printed circuit board and the second printed circuit board, wherein the second flexible printed circuit board is longer than the first flexible printed circuit board, wherein first signal lines are disposed on the first flexible printed circuit board and second signal lines different in signal characteristic from the first signal lines are disposed on the second flexible printed circuit board.

16. The electronic device of claim 15, wherein at least a portion of the second flexible printed circuit board is disposed in parallel with the first flexible printed circuit board.

17. The electronic device of claim 15, wherein the first flexible printed circuit board includes a layer having a first connector formed at an ending portion and a second connector corresponding to the first connector and formed at another ending portion,
the first connector and the second connector are parallel pin connectors each having at least two lines of pins,
the first connector further comprises a first-first line of pins formed at an outermost side of the first flexible printed circuit board and a first-second line of pins formed inside the first-first line of pins,
the second connector further comprises a second-first line of pins formed at the outermost side of the first flexible printed circuit board and a second-second line of pins formed inside the second-first line of pins, and
wherein the first flexible printed circuit board further comprises a first signal line connected from the first-first line of pins to the second-second line of pins, and a second signal line connected from the first-second line of pins to the second-first line of pins.

18. The electronic device of claim 17, wherein the first signal line and the second signal line each correspond to a Mobile Industry Processor Interface (MIPI).

* * * * *